US012706582B2

(12) United States Patent
Ren et al.

(10) Patent No.: US 12,706,582 B2
(45) Date of Patent: Aug. 11, 2026

(54) MULTIPLEXER AND DETECTOR

(71) Applicant: ZHEJIANG LAB, Hangzhou (CN)

(72) Inventors: Sirui Ren, Hangzhou (CN); Xiaohang Zhang, Hangzhou (CN); Xinli Han, Hangzhou (CN); Xinge Huang, Hangzhou (CN); Ran Duan, Hangzhou (CN)

(73) Assignee: ZHEJIANG LAB, Hangzhou (CN)

(*) Notice: Subject to any disclaimer, the term of this patent is extended or adjusted under 35 U.S.C. 154(b) by 0 days.

(21) Appl. No.: 19/141,015

(22) PCT Filed: Mar. 12, 2025

(86) PCT No.: PCT/CN2025/082025

§ 371 (c)(1),
(2) Date: Jun. 18, 2025

(87) PCT Pub. No.: WO2026/129494

PCT Pub. Date: Jun. 25, 2026

(65) Prior Publication Data

US 2026/0058625 A1 Feb. 26, 2026

(30) Foreign Application Priority Data

Dec. 16, 2024 (CN) ......................... 202111846638.7

(51) Int. Cl.
*H01P 1/213* (2006.01)
*H01B 12/06* (2006.01)
(Continued)

(52) U.S. Cl.
CPC ........... *H03H 7/0107* (2013.01); *H01B 12/06* (2013.01); *H01P 1/2135* (2013.01);
(Continued)

(58) Field of Classification Search
CPC ...... H01P 1/213; H01P 1/2135; H01P 1/2136; H03H 7/46; H03H 7/463
(Continued)

(56) References Cited

U.S. PATENT DOCUMENTS 7,012,481 B2 * 3/2006 Maekawa ............. H01P 1/2135 333/204
2011/0032050 A1 2/2011 Kouki
2024/0106123 A1 * 3/2024 Duan ...................... H01P 1/203

FOREIGN PATENT DOCUMENTS

CN 105048029 A 11/2015
CN 109075771 A 12/2018
(Continued)

OTHER PUBLICATIONS

State Intellectual Property Office of the People's Republic of China. Office Action Issued in Chinese Application No. 202411846638.7, Jan. 26, 2025, which is a foreign counterpart application to this application, to which this applicationclaims priority.
(Continued)

*Primary Examiner* — Stephen E. Jones
(74) *Attorney, Agent, or Firm* — BSJ & Sun LLC

(57) ABSTRACT

A multiplexer includes a dielectric base plate, a connection structure, and a plurality of bandpass filters with different operation frequencies. A conductive thin film layer is disposed on a side plane of the dielectric base plate, and includes a signal wire and one or more grounding plates on a side of the signal wire. The connection structure is disposed on the conductive thin film layer, and includes a main branch and a plurality of branches, where the main branch is connected to the plurality of branches respectively, and serves as an input port of the multiplexer. Each of the plurality of bandpass filters is connected to the signal wire and the one or more grounding plates. The bandpass filter includes a first port and a second port, the first port is
(Continued)

connected to a corresponding branch, and the second port serves as one of output ports of the multiplexer.

18 Claims, 6 Drawing Sheets

(51) Int. Cl.
*H03H 7/01* (2006.01)
*H03H 7/46* (2006.01)
*H03H 7/48* (2006.01)

(52) U.S. Cl.
CPC ........ *H03H 7/0115* (2013.01); *H03H 7/0161* (2013.01); *H03H 7/1791* (2013.01); *H03H 7/463* (2013.01); *H03H 7/482* (2013.01)

(58) Field of Classification Search
USPC .......................................... 333/132, 134, 135
See application file for complete search history.

(56) References Cited

FOREIGN PATENT DOCUMENTS

| | | | |
|---|---|---|---|
| CN | 112072241 | A | 12/2020 |
| CN | 112840561 | A | 5/2021 |
| CN | 115882813 | A | 3/2023 |
| CN | 115911796 | A | 4/2023 |
| CN | 220440686 | U | 2/2024 |
| CN | 119315235 | A | 1/2025 |

OTHER PUBLICATIONS

State Intellectual Property Office of the People's Republic of China. Notice of Allowance Issued in Chinese Application No. 202411846638. 7, Feb. 27, 2025, which is a foreign counterpart application to this application, to which this applicationclaims priority.

ISA State Intellectual Property Office of the People's Republic of China, International Search Report and Written Opinion of the International Searching Authority Issued in Application No. PCT/CN2025/082025, Sep. 5, 2025, WIPO, 19 pages.

* cited by examiner

MULTIPLEXER AND DETECTOR

CROSS-REFERENCE TO RELATED APPLICATIONS

The present disclosure is a U.S. national phase of PCT Application No. PCT/CN2025/082025 filed on Mar. 12, 2025, which claims priority to Chinese Patent Application No. 202411846638.7, filed with the Chinese Patent Office on Dec. 16, 2024, both of which are hereby incorporated by reference in their entireties.

TECHNICAL FIELD

The present disclosure relates to a field of superconducting devices, and in particular to a multiplexer and a detector.

BACKGROUND

In astronomical observation and imaging systems, high-sensitivity low-temperature superconducting detectors occupy important positions, especially in millimeter wave bands and terahertz wave bands with higher frequencies. At present, a large scale array is formed by using a plurality of detectors as pixel units, so that a spatial resolution and a field angle may be improved, which is beneficial to improve a performance of a system. Usage of multi-color pixels can simultaneously realize observation of multiple frequency bands, which is beneficial to improve a utilization rate of the millimeter wave observation frequency bands. However, increasing a communication rate of the millimeter wave needs to be implemented by a multiplexer.

In related techniques, the multiplexer adopts a terminal short-circuit microstrip structure with a quarter wavelength (such as a microstrip line or wire), where a metal conductor is on a side of a dielectric base plate in the structure, and a grounding plate is on the other side. The metal conductor is connected to the grounding plate through a metal via hole, which involves a complex process, and is not conducive to the integration between the multiplexer and other components of the detector. In addition, a metal loss and radiation loss of the structure are large, which reduces the performance of the multiplexer.

SUMMARY

The present disclosure provides a multiplexer and a detector, to solve at least a part of problems in the related techniques.

An aspect of the present disclosure provides a multiplexer. The multiplexer includes: a dielectric base plate, where a conductive thin film layer is disposed on a side plane of the dielectric base plate, the conductive thin film layer includes a signal wire and one or more grounding plates on a side of the signal wire, and there is one or more gaps between the signal wire and the one or more grounding plates; a connection structure, disposed on a side, on which the conductive thin film layer is provided, of the dielectric base plate, and including a main branch and a plurality of branches, where the main branch is connected to the plurality of branches respectively, and the main branch serves as an input port of the multiplexer; and a plurality of bandpass filters with different operation frequencies, where each of the plurality of bandpass filters is disposed on the side, on which the conductive thin film layer is provided, of the dielectric base plate, and is connected to the signal wire and the one or more grounding plates; where for each bandpass filter of the plurality of bandpass filters, the bandpass filter includes a first port and a second port, the first port is connected to a corresponding branch of the plurality of branches, and the second port serves as one of a plurality of output ports of the multiplexer.

Optionally, the plurality of branches include a first branch and a second branch; the plurality of bandpass filters includes a first bandpass filter and a second bandpass filter; the first port of the first bandpass filter is connected to the first branch; and the first port of the second bandpass filter is connected to the second branch.

Optionally, for each branch of the plurality of branches, an impedance of the branch matches an operation frequency of a bandpass filter which corresponds to the branch, and does not match an operation frequency of a bandpass filter which corresponds to the other branch.

Optionally, for each bandpass filter of the plurality of bandpass filters, the bandpass filter includes one or more first resonant units and one or more second resonant units; each of the one or more first resonant units and the one or more second resonant units generates a zero point and a pole point; the one or more first resonant units are coupled to the one or more second resonant units; and a frequency of each of pole points generated respectively by the one or more first resonant units and the one or more second resonant units is located between frequencies of zero points generated respectively by the one or more first resonant units and the one or more second resonant units.

Optionally, two sides of the signal wire both are provided with one or more grounding plates; for each bandpass filter in the plurality of bandpass filters, each of the one or more first resonant units and the one or more second resonant units is connected to the signal wire and the one or more grounding plates on the two sides of the signal wire, and the one or more first resonant units and the one or more second resonant units both are symmetrically disposed with respect to the signal wire.

Optionally, for each bandpass filter of the plurality of bandpass filters, the one or more first resonant units are coupled to the one or more second resonant units by the signal wire.

Optionally, for each bandpass filter of the plurality of bandpass filters, the one or more first resonant units and the one or more second resonant units are quasi-lumped resonant units.

Optionally, for each bandpass filter of the plurality of bandpass filters, the bandpass filter includes two first resonant units and two second resonant units; one first resonant unit of the two first resonant units is coupled to one second resonant unit of the two second resonant units, to form a first coupling unit; other first resonant unit of the two first resonant units is coupled to other second resonant unit of the two second resonant units, to form a second coupling unit; and the first resonant unit in the first coupling unit is coupled to the first resonant unit in the second coupling unit, or the second resonant unit in the first coupling unit is coupled to the second resonant unit in the second coupling unit; the first coupling unit and the second coupling unit are symmetrically disposed with respect to a coupling part between the first coupling unit and the second coupling unit; and the first coupling unit is coupled to the second coupling unit by the signal wire.

Optionally, each of the one or more first resonant units includes one or more first capacitors and one or more first inductors; where the one or more first capacitors and the one or more first inductors are connected in parallel between the signal wire and the one or more grounding plates, where each of the one or more first capacitors is an interdigital capacitor; and each of the one or more second resonant units includes a second capacitor, one or more second inductors, and one or more third inductors; where the second capacitor is connected in series with the signal wire, the one or more second inductors are connected in parallel with the second capacitor, and the one or more third inductors are connected between the signal wire and the one or more grounding plates; where the second capacitor is an interdigital capacitor.

Optionally, the first resonant unit includes two first capacitors and two first inductors, and the two first capacitors and the two first inductors are all symmetrically disposed with respect to the signal wire; and the second resonant unit includes two second inductors and two third inductors, and the second capacitor, the two second inductors, and the two third inductors are all symmetrically disposed with respect to the signal wire.

Another aspect of the present disclosure provides a detector. The detector includes an antenna, an orthogonal mode coupler, a plurality of dynamic inductor thermal radiators, and the multiplexer in any one of the above embodiments; where the antenna is connected to the orthogonal mode coupler; the orthogonal mode coupler is connected to an input port of the multiplexer; the plurality of dynamic inductor thermal radiators are respectively connected to a plurality of output ports of the multiplexer; and the orthogonal mode coupler, the plurality of dynamic inductor thermal radiators, and the multiplexer share one dielectric base plate.

The multiplexer provided in the present disclosure includes a dielectric base plate, a connection structure, and a plurality of bandpass filters with different operation frequencies. The conductive thin film layer is disposed on the plane on the side of the dielectric base plate, the conductive thin film layer includes the signal wire and the grounding plates located on the sides of the signal wire, the connection structure is disposed on a side, on which the conductive thin film layer is provided, of the dielectric base plate, each of the plurality of bandpass filters with different operation frequencies is disposed on the side, on which the conductive thin film layer is provided, of the dielectric base plate, and is connected to the signal wire and the grounding plates. The signal wire, the grounding plates, the connection structure, and the bandpass filters may be located on the plane on the same side of the dielectric base plate, and field distribution of the multiplexer may be concentrated between the signal wire and the grounding plates in the same layer, which may reduce the metal loss and the radiation loss and improve the performance of the multiplexer. In addition, the structure and the process are simple, which may achieve the grounding in the same layer without a grounding via hole, and is beneficial for integration between the multiplexer and other components of the detector.

BRIEF DESCRIPTION OF DRAWINGS

The accompanying drawings here are incorporated into the specification and form a part of this specification, show embodiments conforming to the present disclosure and are used together with the specification to explain principles of the present disclosure.

Figure 1:
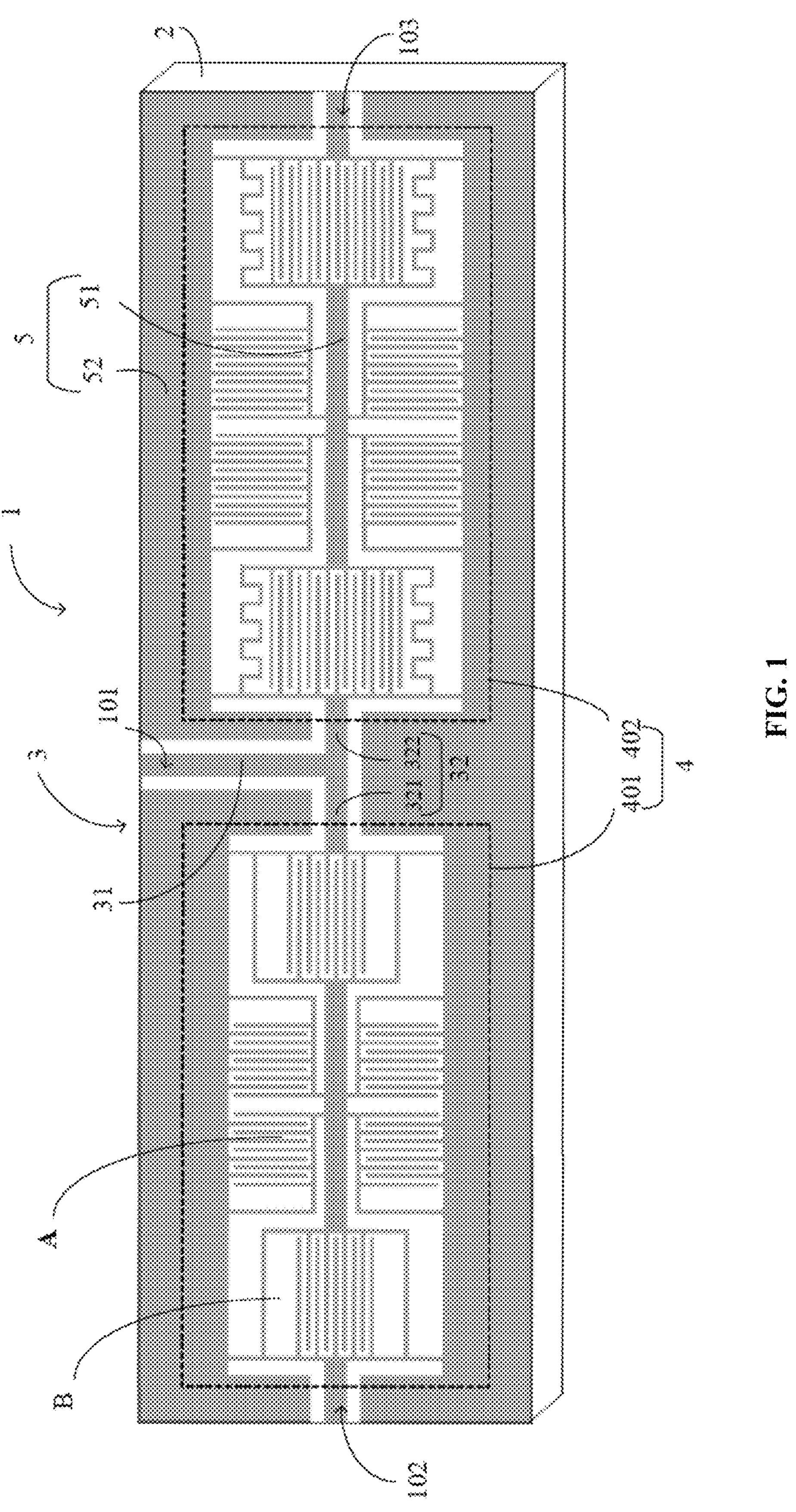
FIG. 1 is a schematic structural diagram of a multiplexer shown by an embodiment of the present disclosure.

REFERENCE SIGNS multiplexer 1; dielectric base plate 2; connection structure 3; bandpass filter 4; input port 101;
first output port 102; second output port 103;
conductive thin film layer 5; signal wire 51; grounding plate 52;
main branch 31; branch 32; first branch 321; second branch 322;
first bandpass filter 401; second bandpass filter 402;
first resonant unit A; second resonant unit B; and
first capacitor 41; first inductor 42; second capacitor 43; second inductor 44; third inductor 45.

DETAILED DESCRIPTION

Exemplary embodiments will be described in details herein, with examples thereof represented in the accompanying drawings. When the following description involves the accompanying drawings, same numerals in different figures represent same or similar elements unless otherwise indicated. Implementations described in the following exemplary embodiments do not represent all implementations consistent with the present disclosure. Rather, they are only examples of apparatuses and methods that are consistent with some aspects of the present disclosure as detailed in the attached claims.

Referring to FIG. 1, FIG. 1 is a schematic structural diagram of a multiplexer 1 shown by an embodiment of the present disclosure. As shown in FIG. 1, the multiplexer 1 includes a dielectric base plate 2, a connection structure 3, and a plurality of bandpass filters 4 with different operation frequencies. A conductive thin film layer 5 is disposed on a side plane of the dielectric base plate 2, and there is no metal coating on a bottom of the dielectric base plate 2. The conductive thin film layer 5 is made of a superconducting material. The superconducting material typically has a very low resistance and is capable of conducting a current without energy loss below a critical temperature, which may reduce a loss and enhance a low temperature conductivity. The conductive thin film layer 5 may adopt a photolithography process, and a processing accuracy thereof may reach a micrometer scale. The conductive thin film layer 5 is disposed on the dielectric base plate 2, and the dielectric base plate 2 may be used as a substrate to facilitate integration and processing of various functional devices in the system.

The conductive thin film layer 5 includes a signal wire 51 and one or more grounding plates 52 located on one or more sides of the signal wire 51. As shown in FIG. 1, there may be one or more gaps between the signal wire 51 and the one or more grounding plates 52. In the embodiment shown in FIG. 1, two sides of the signal wire 51 both are provided with one or more grounding plates 52, the signal wire 51 is located between the grounding plates 52 on the two sides, and the gap exists between the signal wire 51 and each of the grounding plates 52 on the two sides, so that the device disposed on the dielectric base plate 2 is connected to the signal wire 51 and the grounding plates 52.

The connection structure 3 is disposed on the conductive thin film layer 5 and includes a main branch 31 and a plurality of branches 32. The main branch 31 is connected to the plurality of branches 32 respectively. The main branch 31 serves as an input port 101 of the multiplexer 1, and may receive a plurality of signals with different operation frequencies. Each of the plurality of bandpass filters 4 with the different operation frequencies is connected to the signal wire 51 and the grounding plates 52.

Each bandpass filter 4 includes a first port and a second port. The first port is connected to a corresponding branch 32, so that a signal with a corresponding operation frequency may enter a corresponding bandpass filter 4 through the branch 32 and the first port, and is output through the second port. In other words, the second port of the bandpass filter 4 may serve as an output port of the multiplexer 1. The multiplexer 1 can distribute signals with different frequencies input through an input port 101 to different output channels for output, which can therefore effectively avoid the signal interference between the different output channels.

The conductive thin film layer 5 is disposed on the plane on the side of the dielectric base plate 2, the conductive thin film layer 5 includes the signal wire 51 and the grounding plates 52 located on the sides of the signal wire 51, the connection structure 3 is disposed on a side, on which the conductive thin film layer 5 is provided, of the dielectric base plate 2, each of the plurality of bandpass filters 4 with different operation frequencies is disposed on the side, on which the conductive thin film layer 5 is provided, of the dielectric base plate 2, and is connected to the signal wire 51 and the grounding plates 52, so that the signal wire 51, the grounding plates 52, the connection structure 3, and the bandpass filters 4 may be located on the plane on the same side of the dielectric base plate 2, and field distribution of the multiplexer 1 may be concentrated between the signal wire 51 and the grounding plates 52 in the same layer, which may therefore reduce the metal loss and the radiation loss. In this way, the performance of the multiplexer 1 may be effectively improved, and the structure and the process are simple. In particular, grounding may be achieved in the same layer without a grounding via hole, which is beneficial for integration between the multiplexer and other components of the detector, for example.

In the embodiment shown in FIG. 1, the multiplexer 1 is a duplexer, and the plurality of branches 32 include a first branch 321 and a second branch 322. The plurality of bandpass filters 4 with different operation frequencies includes a first bandpass filter 401 and a second bandpass filter 402. A first port of the first bandpass filter 401 is connected to the first branch 321, and a first port of the second bandpass filter 402 is connected to the second branch 322. A second port of the first bandpass filter 401 serves as a first output port 102 of the duplexer, and a second port of the second bandpass filter 402 serves as a second output port 103 of the duplexer.

In the embodiment shown in FIG. 1, the connection structure 3 is T-shaped, and the duplexer is formed by the T-shaped connection structure 3 and the first bandpass filter 401 and the second bandpass filter 402 that have different operation frequencies. For example, a center frequency of the first bandpass filter 401 is 280 GHz, a 3 dB fractional bandwidth thereof is about 17.9%; the center frequency of the second bandpass filter 402 is 220 GHz, and the 3 dB fractional bandwidth thereof is about 25.5%. The duplexer has one input port 101 and two output ports, which are the first output port 102 and the second output port 103, respectively. The T-shaped connection structure 3 includes the main branch 31, the first branch 321, and the second branch 322. The main branch 31 is perpendicular to the first branch 321 and the second branch 322. The first branch 321 is substantially parallel to the second branch 322, and the first branch 321 and the second branch 322 are respectively located on two sides of the main branch 31.

An impedance of each branch 32 matches the operation frequency of the bandpass filter 4 which corresponds to the branch 32, and does not match the operation frequency of the bandpass filter 4 which corresponds to the other branch 32. In this way, an isolation degree of the multiplexer 1 may be improved, mutual electromagnetic wave leakage of the plurality of branches 32 of the connection structure 3 may be reduced, and better isolation between different channels may be achieved. Specifically, the isolation between different channels may be achieved by using quarter wavelength impedance transformation to find an equivalent open road surface.

A first resonant unit A and a second resonant unit B are quasi-lumped resonant units. The quasi-lumped resonant unit has a compact and smaller size and a higher quality factor, such that the size of the corresponding duplexer is approximately 300×50 $\mu m^2$. In particular, compared with a duplexer adopting a terminal short-circuit microstrip line with a quarter wavelength, the size of the duplexer adopting the quasi-lumped resonant unit is reduced by about 70%, and the compact structure obviously more facilitates large-scale integration.

In the embodiment shown in FIG. 1, each bandpass filter 4 includes one or more first resonant units A and one or more second resonant units B. Each of the first resonant unit A and the second resonant unit B generates a zero point and a pole point. The first resonant unit A is coupled to the second resonant unit B. The frequency of each of the pole points generated respectively by the first resonant unit A and the second resonant unit B respectively is located between frequencies of the zero points generated respectively by the first resonant unit A and the second resonant unit B.

When the first resonant unit A is coupled to the second resonant unit B, the frequencies of the pole points are located between the frequencies of the zero points, and a frequency response with in-band flatness and strong out-of-band rejection is formed, so that the millimeter wave bandpass filter 4 with a corresponding design frequency band has a compact structure and stronger out-of-band rejection. In this way, the transmission zero of the bandpass filter for each channel is properly distributed into a passband of the bandpass filter for another channel, which may improve the output isolation and the out-of-band rejection. There is a transmission zero point on each of left and right sides of the two passbands, so that the passband frequency selection performance and the out-of-band rejection performance are excellent.

As shown in FIG. 1, the grounding plate 52 is disposed on each of two sides of the signal wire 51, so that each of the first resonant units A and the second resonant units B in each bandpass filter 4 is connected to the signal wire 51 and the grounding plates 52 on the two sides of the signal wire 51, and the first resonant units A and the second resonant units B both are symmetrically disposed with respect to the signal wire 51. The grounding plate 52 is disposed on each of two sides of the signal wire 51, and the gap exists between the signal wire 51 and each of the grounding plates 52 on the two sides, so that the device disposed on the dielectric base plate 2 is connected to the signal wire 51 and the grounding plates 52. The first resonant units A and the second resonant units B in the bandpass filter 4 both are symmetrically disposed with respect to the signal wire 51, which may ensure that the bandpass filter 4 generates a smaller common-mode radiation loss in a higher frequency band.

The first resonant units A and the second resonant units B in the bandpass filter 4 are quasi-lumped resonant units. The quasi-lumped resonant unit has a compact and smaller size and a higher quality factor. In this way, when the bandpass filter 4 is designed, a flat passband and a plurality of out-of-band transmission zero points may be implemented through a combination of a quasi-lumped capacitor and inductor, which can thereby effectively improve out-of-band rejection performance, and facilitate a corresponding duplexer to implement the good passband transmission performance and isolation degree.

Figures 2, 3:
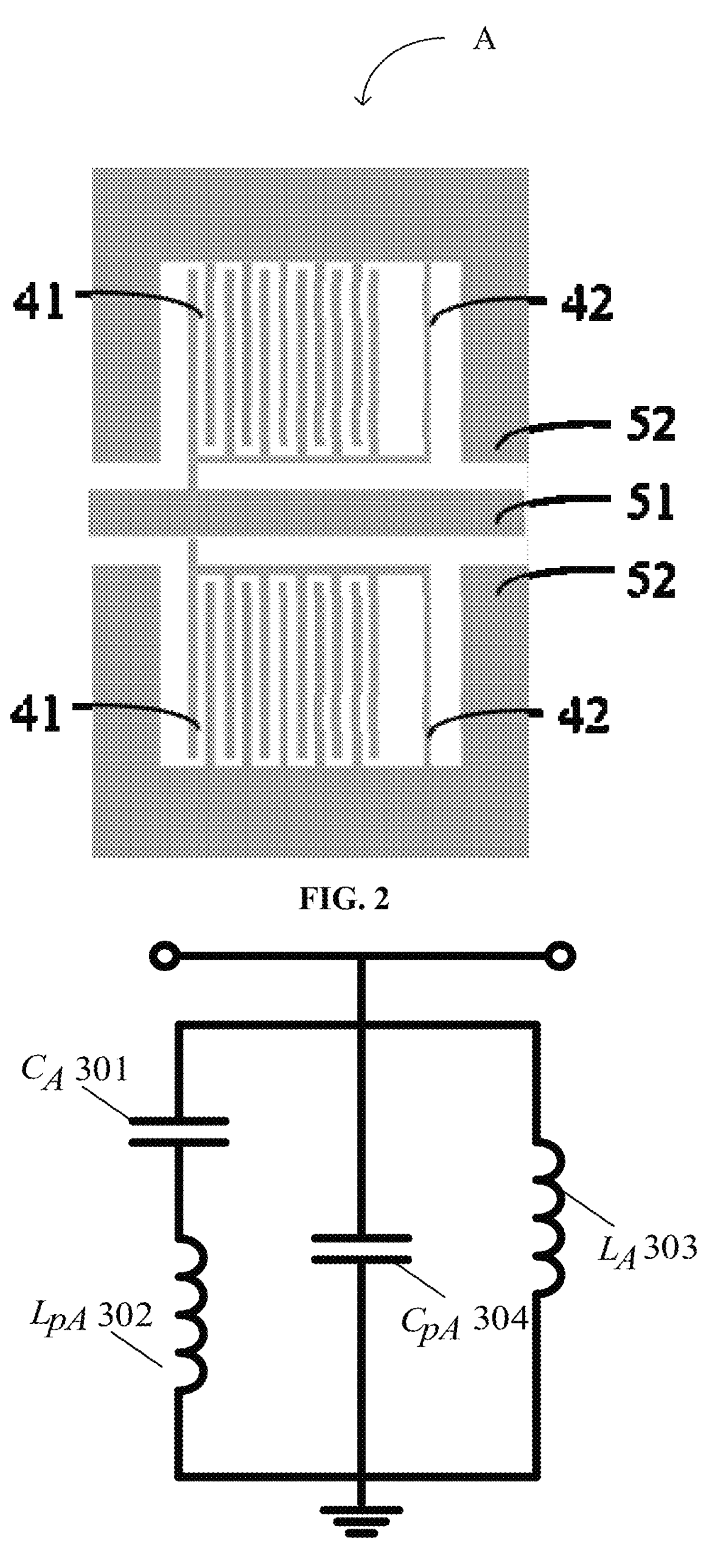
FIG. 2 is a schematic structural diagram of the first resonant unit in the multiplexer shown in FIG. 1.
FIG. 3 is a schematic diagram of an equivalent circuit of the first resonant unit shown in FIG. 2.

Referring to FIG. 2, FIG. 2 is a schematic structural diagram of the first resonant unit A in the multiplexer 1 shown in FIG. 1. As shown in FIG. 2, the first resonant unit A includes one or more first capacitors 41 and one or more first inductors 42, and the first capacitors 41 and the first inductors 42 are connected in parallel between the signal wire 51 and the grounding plates 52, which is equivalent to that the first capacitors 41 and the first inductors 42 are grounded in parallel with respect to the signal wire 51. The first capacitor 41 is an interdigital capacitor. The interdigital capacitor has a plurality of finger structures in which electrodes of the capacitor are designed to be staggered each other, thereby providing a larger effective capacitance area. Compared with a traditional planar capacitor, the interdigital capacitor has a larger capacitance value, and may improve the integration density of the capacitor.

For example, in the embodiment shown in FIG. 2, the first resonant unit A includes two first capacitors 41 and two first inductors 42, and the two first capacitors 41 and the two first inductors 42 are all symmetrically disposed with respect to the signal wire 51. The two first capacitors 41 and the two first inductors 42 are all symmetrically disposed with respect to the signal wire 51, to ensure that the first resonant unit A generates a smaller common-mode radiation loss in a higher frequency band.

Referring to FIG. 3, FIG. 3 is a schematic diagram of an equivalent circuit of the first resonant unit A shown in FIG. 2. Since the conductive thin film layer 5 is formed by a superconducting thin film, the resistance of the conductive thin film layer 5 may be ignored. The equivalent circuit of the first resonant unit A shown in FIG. 2 is shown in FIG. 3. $C_A$ 301 is an equivalent capacitance of the two first capacitors 41, $L_{pA}$ 302 is a parasitic inductance of the two first capacitors 41, $L_A$ 303 is an equivalent inductance of the two first inductors 42, and $C_{pA}$ 304 is a substrate parasitic capacitance of the two first capacitors 41 and the two first inductors 42. According to a circuit zero-pole point generation mechanism, the first resonant unit A may generate one transmission pole point and one transmission zero point.

The zero point of the first resonant unit A is mainly generated by a series loop, that is grounded in parallel, formed by the equivalent capacitance $C_A$ 301 and the parasitic inductance $L_{pA}$ 302. As seen from a signal main circuit, when an equivalent input impedance of the series grounding loop formed by the equivalent capacitance $C_A$ 301 and the parasitic inductance $L_{pA}$ 302 at a certain frequency point is 0, the signal is short-circuited, that is, a transmission zero point is formed at the frequency. The frequency of the zero point and the frequency of the pole point may be calculated by the equivalent circuit of the first resonant unit A, the frequency of the zero point and the frequency of the pole point are represented by a capacitance value and an inductance value, and the frequency of the zero point may be higher than the frequency of the pole point by controlling the values of the first capacitance 41 and the first inductance 42.

Figure 4:
FIG. 4 is a schematic structural diagram of the second resonant unit in the multiplexer shown in FIG. 1.
Figure 4:
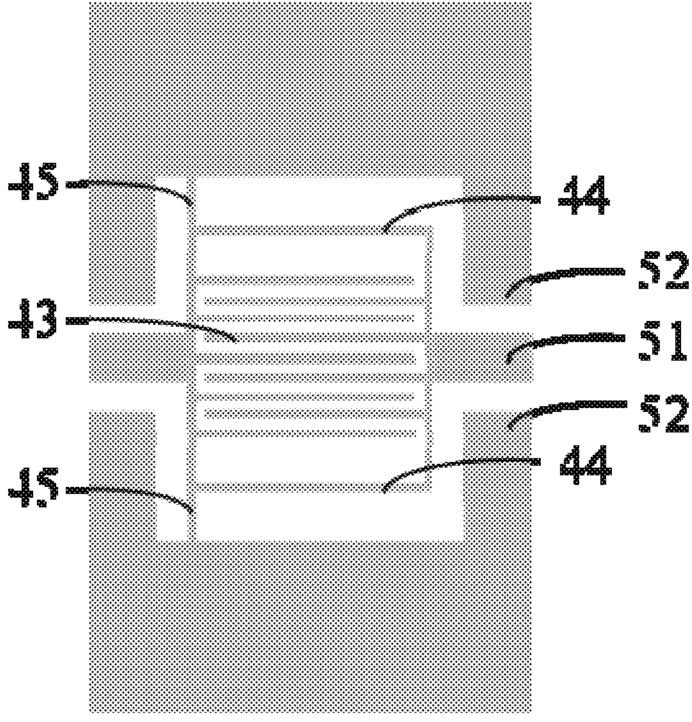

Referring to FIG. 4, FIG. 4 is a schematic structural diagram of the second resonant unit B in the multiplexer 1 shown in FIG. 1. As shown in FIG. 4, the second resonant unit B includes a second capacitor 43, one or more second inductors 44, and one or more third inductors 45. The second capacitor 43 is connected in series with the signal wire 51, the second inductors 44 are connected in parallel with the second capacitor 43, and the third inductors 45 are connected between the signal wire 51 and the grounding plates 52. The second capacitor 43 is an interdigital capacitor. The second resonant unit B includes two second inductors 44 and two third inductors 45. The second capacitor 43, the two second inductors 44, and the two third inductors 45 are all symmetrically disposed with respect to the signal wire 51. The second capacitor 43, the two second inductors 44, and the two third inductors 45 are all symmetrically disposed with respect to the signal wire 51, which may ensure that the second resonant unit B generates a smaller common-mode radiation loss in a higher frequency band.

Figure 5:
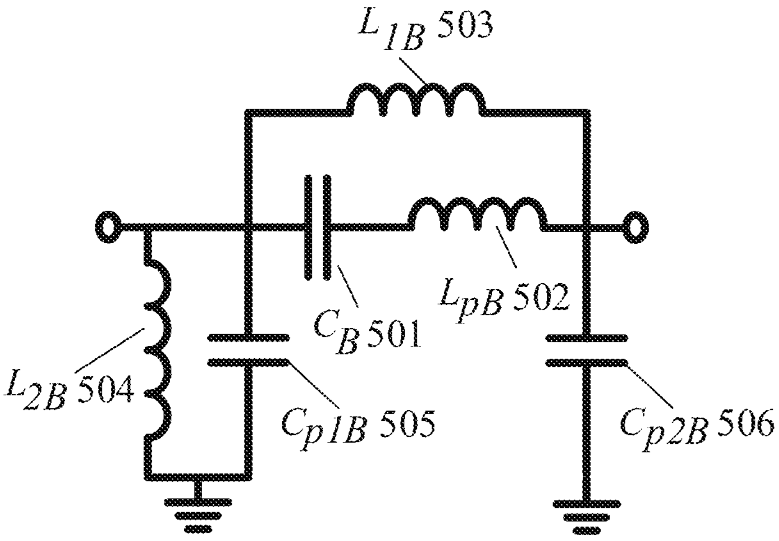
FIG. 5 is a schematic diagram of an equivalent circuit of the second resonant unit shown in FIG. 4.

Referring to FIG. 5, FIG. 5 is a schematic diagram of an equivalent circuit of the second resonant unit B shown in FIG. 4. After connecting equivalent circuit models of the second capacitor 43, the second inductors 44, and the third inductors 45 according to FIG. 4, parallel capacitors having the same node are combined to obtain an equivalent circuit diagram of the second resonant unit B, as shown in FIG. 5. $C_B$ 501 is an equivalent capacitance of the second capacitor 43, $L_{pB}$ 502 is a parasitic inductance of the second capacitor 43, $L_{1B}$ 503 is an equivalent inductance of the two second inductors 44, $L_{2B}$ 504 is an equivalent inductance of the two third inductors 45, and $C_{p1B}$ 505 and $C_{p2B}$ 506 are substrate parasitic capacitances. According to a circuit zero-pole point generation mechanism, the second resonant unit B may generate two transmission pole points and one transmission zero point. The zero point is generated by a loop formed by the equivalent capacitance $C_B$501, the parasitic inductance $L_{pB}$ 502, and the equivalent inductance $L_{1B}$ 503, one pole point is generated by a circuit formed by connecting the equivalent capacitance $C_B$ 501, the parasitic inductance $L_{pB}$ 502 in series, and the other pole point is generated by a circuit formed by the parallel and grounded equivalent inductance $L_{2B}$ 504 and substrate parasitic capacitances $C_{p1B}$ 505 and $C_{p2B}$ 506. By adjusting the values of the second capacitor 43, the second inductors 44, and the third inductors 45, the position of the frequency of the zero point may be lower than the position of the frequencies of the pole points.

Figure 6:
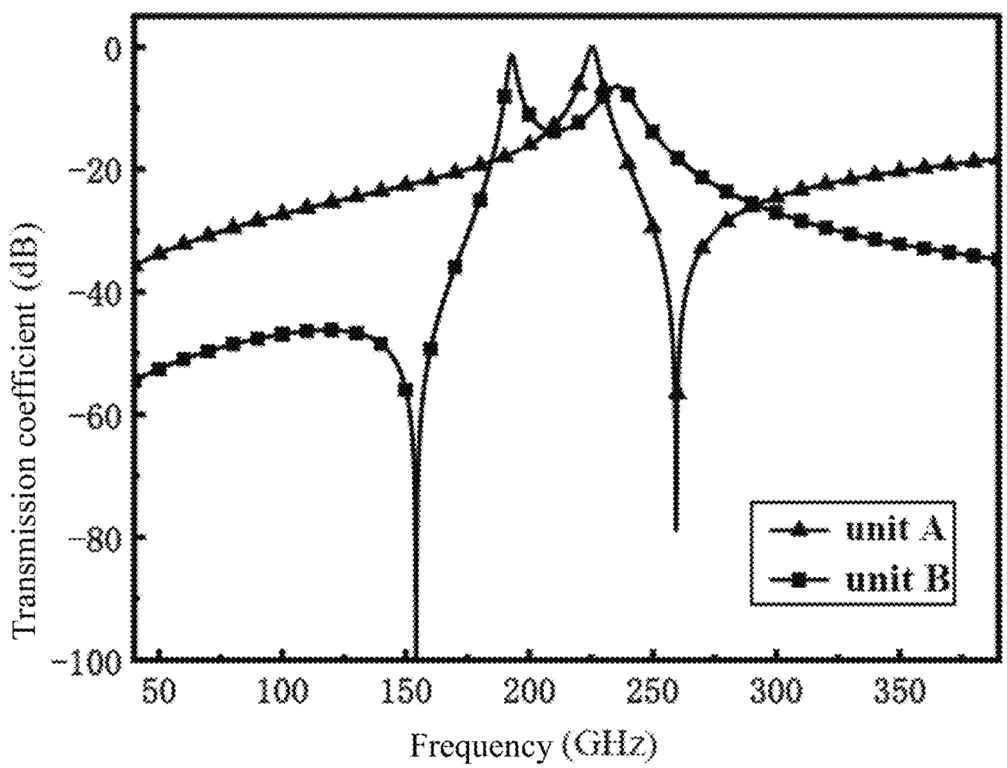
FIG. 6 is a schematic diagram of resonant characteristics of the first resonant unit and the second resonant unit in the multiplexer shown in FIG. 1.

Referring to FIG. 6, FIG. 6 is a schematic diagram of resonant characteristics of the first resonant unit A and the second resonant unit B in the multiplexer 1 shown in FIG. 1. In this embodiment of the present disclosure, by controlling the values of the first capacitors 41 and the first inductors 42, the frequency of the zero point and the frequency of the pole point generated by the first resonant unit A may be controlled, so that the frequency of the zero point generated by the first resonant unit A is higher than the frequency of the pole point. By controlling the values of the second capacitor 43, the second inductors 44, and the third inductors 45, the frequency of the zero point and the frequencies of the pole points generated by the second resonant unit B may be controlled, so that the frequencies of the pole points generated by the second resonant unit B is higher than the frequency of the zero point. When the first resonant unit A is coupled to the second resonant unit B, the values of the first capacitors 41, the first inductors 42, the second capacitor 43, the second inductors 44, and the third inductors 45 may be controlled, so that the frequencies of the pole points generated by the first resonant unit A and the second resonant unit B respectively are located between the frequencies of the zero points generated by the first resonant unit A and the second resonant unit B respectively.

In FIG. 6, the abscissa represents the frequency, and the ordinate represents a transmission coefficient (that is, an S parameter). The unit A identifies a transmission coefficient curve of the first resonant unit A, and the unit B identifies a transmission coefficient curve of the second resonant unit B. It can be seen from FIG. 6 that the first resonant unit A has one pole point and one zero point whose frequency is higher than the frequency of the pole point. The second resonant unit B has two pole points and one zero point whose frequency is lower than the frequencies of the pole points.

The resonant characteristics of the first resonant unit A and the second resonant unit B show that by properly coupling between the first resonant unit A and the second resonant unit B, the frequency response of the required passband may be constructed, so that the corresponding bandpass filter has a compact structure, and transmission zero points may be generated at the upper and lower stopbands for the passband, thereby facilitating high frequency selectivity. In this embodiment, the first resonant unit A is coupled to the second resonant unit B by the signal wire 51, which is embodied as inductive coupling, and may reduce the radiation losses compared to capacitive coupling.

Figure 7:
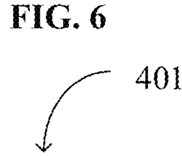
FIG. 7 is a schematic structural diagram of the first bandpass filter in the multiplexer shown by an embodiment of the present disclosure.
Figure 7:
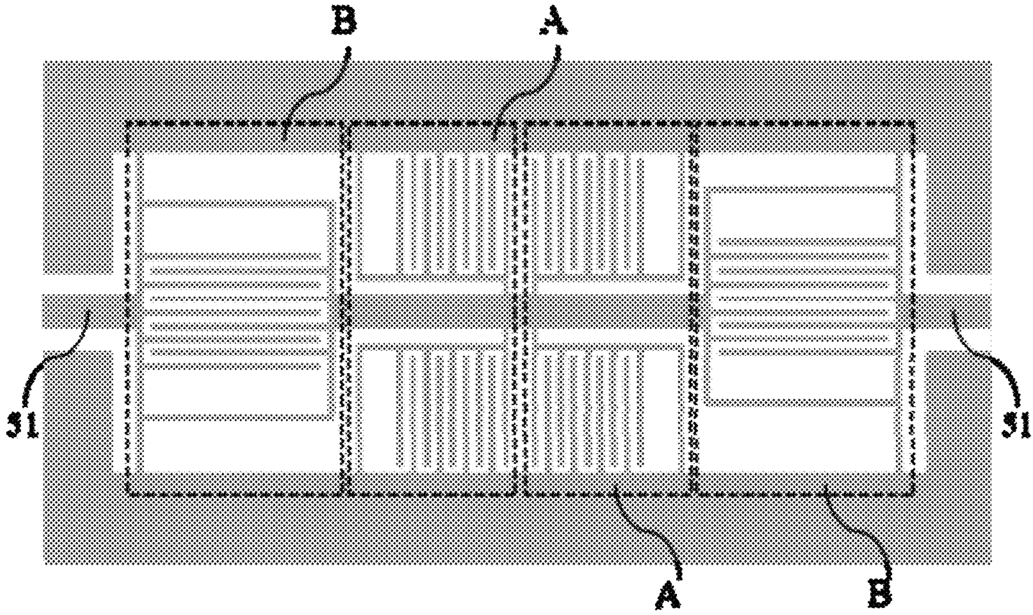

Referring to FIG. 7, FIG. 7 is a schematic structural diagram of the first bandpass filter 401 in the multiplexer 1 shown by an embodiment of the present disclosure. In the embodiment shown in FIG. 7, each bandpass filter 4 includes two first resonant units A and two second resonant units B. One first resonant unit A is coupled to one second resonant unit B to form a first coupling unit, and the other first resonant unit A is coupled to the other second resonant unit B to form a second coupling unit. The first coupling unit is coupled to the second coupling unit through the two first resonant units A or the two second resonant units B (that is, the first resonant unit A in the first coupling unit is coupled to the first resonant unit A in the second coupling unit, or the second resonant unit B in the first coupling unit is coupled to the second resonant unit B in the second coupling unit). The first coupling unit is coupled to the second coupling unit through the signal wire 51. Coupling through the signal wire 51 is embodied as inductive coupling, which may reduce the radiation loss compared to the capacitive coupling. By the coupling between the two first resonant units A and the two second resonant units B, a passband with six pole points and three zero points may be obtained. The enough pole points and zero points are beneficial to achieve the good flatness and frequency selectivity of the passband.

The first coupling unit and the second coupling unit are symmetrically disposed with respect to a coupling part between the first coupling unit and the second coupling unit. A structure of coupling a first resonant unit A, a second resonant unit B, a second resonant unit B, and a first resonant unit A may be formed, or a structure of coupling a second resonant unit B, a first resonant unit A, a first resonant unit A, and a second resonant unit B may be formed.

Similarly, the second bandpass filter 402 has a similar structure, and the second bandpass filter 402 may operate at an operation frequency different from the operation frequency of the first bandpass filter 401 by changing physical sizes of the first resonant unit A and the second resonant unit B in the second bandpass filter 402. By changing the physical sizes of the first resonant unit A and the second resonant unit B in the other bandpass filter 4, the other bandpass filter 4 may operate at a different operation frequency.

Figure 8:
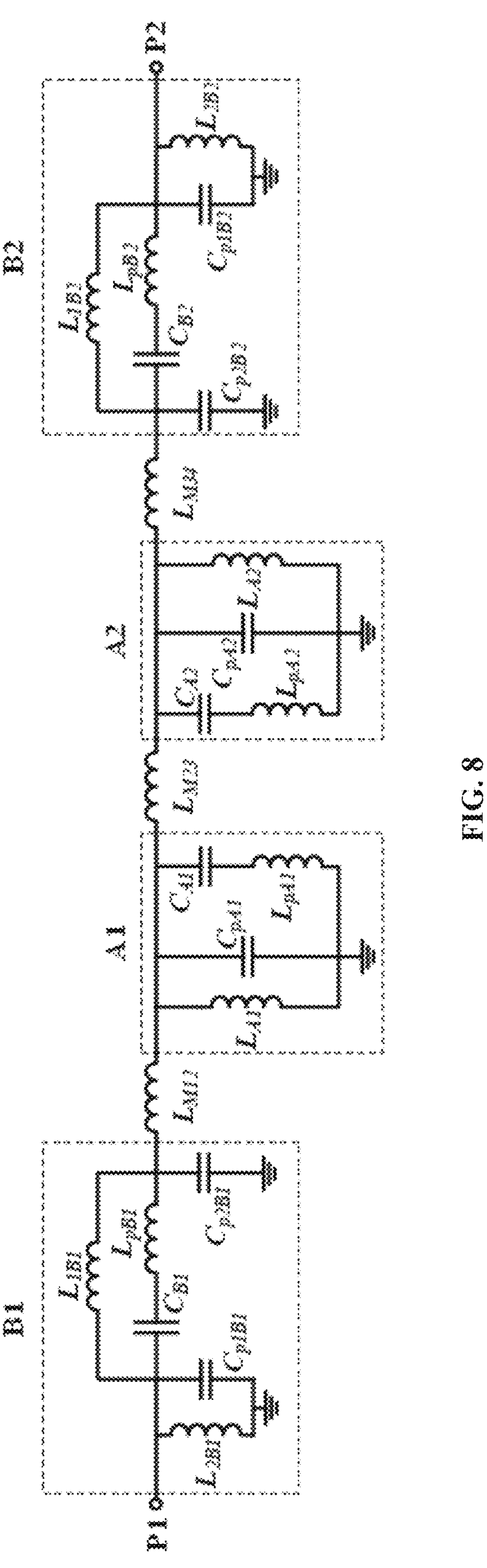
FIG. 8 is a schematic diagram of an equivalent circuit of the first bandpass filter in the multiplexer shown in FIG. 7.

FIG. 8 is a schematic diagram of an equivalent circuit of the first bandpass filter 401 in the multiplexer 1 shown in FIG. 7. The first bandpass filter 401 is constructed according to the equivalent circuit models of the first resonant unit A and the second resonant unit B in FIG. 3 and FIG. 5, to achieve a good bandpass frequency response. The second resonant unit B is inductively coupled to the first resonant unit A through the signal wire 51, which is represented by the inductance $L_{M12}$. The first resonant unit A is inductively coupled to the first resonant unit A through the signal wire 51, which is represented by the inductance $L_{M23}$. The first resonant unit A is inductively coupled to the second resonant unit B through the signal wire 51, which is represented by the inductance $L_{M34}$.

The strength of the inductive coupling may be adjusted by the signal wire 51 to achieve a desired frequency response. For the formed bandpass filtering circuit, the passband center frequency is 280 GHz, each of the upper and lower sidebands has two transmission zeros, which may achieve a sixth-order bandpass frequency response with flat passband and good out-of-band rejection characteristics. Similarly, the schematic diagram of the equivalent circuit of the second bandpass filter 402 is similar, but the values of the capacitors and the inductors thereof are different, so that the passband center frequency at which the second bandpass filter 402 operates is 220 GHz.

Figure 9:
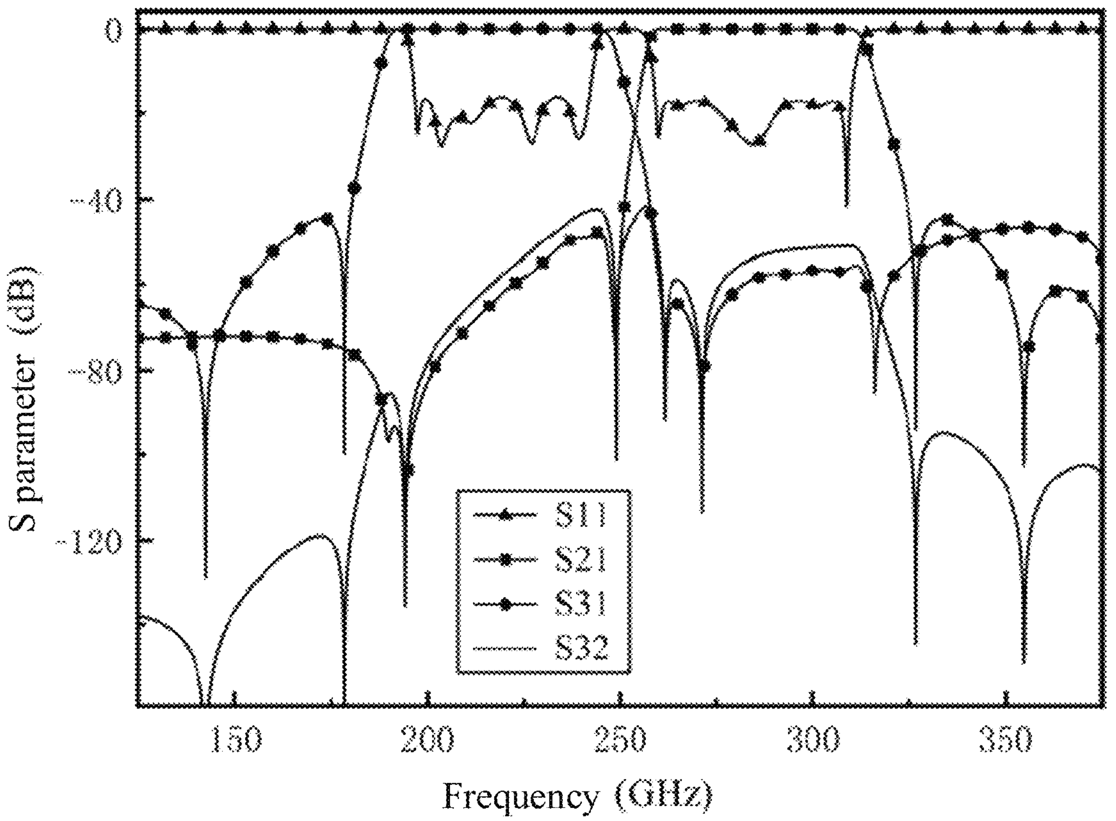
FIG. 9 is a simulation result diagram of an S parameter of a duplexer shown by an embodiment of the present disclosure.

Referring to FIG. 9, FIG. 9 is a simulation result diagram of an S parameter of a duplexer shown by an embodiment of the present disclosure. Simulation software, a high frequency structure simulator (HFSS), is used to simulate the frequency response of the duplexer in the above embodiment to verify its performance, and the result is shown in FIG. 9. The two passband center frequencies of the duplexer are 220 GHz (operation frequency of the first bandpass filter 401) and 280 GHz (operation frequency of the second bandpass filter 402), respectively. S11 identifies a return wave loss curve of the input port 101 of the duplexer, S21 identifies an insertion loss curve of the first output port 102 of the duplexer, S31 identifies an insertion loss curve of the second output port 103 of the duplexer, and S32 identifies an isolation degree curve of the first output port 102 and the second output port 103 of the duplexer. It can be seen that in the two frequency bands of 220 GHz and 280 GHz, the return wave loss of the input port 101 of the duplexer is less than −16 dB, and the insertion loss of each of the first output port 102 and the second output port 103 is less than 0.5 dB. FIG. 9 proves that signals in the design frequency band of the duplexer obtained by the method of the present disclosure can all pass well, and signals in other frequency bands that are not required are attenuated. In addition, the isolation degree between the first output port 102 and the second output port 103 is greater than 42 dB, which proves that signals of two frequency bands of the first bandpass filter 401 and the second bandpass filter 402 of the duplexer do not substantially interfere with each other, and the simulation verifies the feasibility of the duplexer of the present disclosure.

Another aspect of the present disclosure provides a detector, including an antenna, an orthogonal mode coupler, a plurality of dynamic inductor thermal radiators, and the multiplexer 1. The antenna is connected to the orthogonal mode coupler, the orthogonal mode coupler is connected to the input port 101 of the multiplexer 1, the plurality of dynamic inductor thermal radiators are respectively connected to the plurality of output ports of the multiplexer 1, and the orthogonal mode coupler, the plurality of dynamic inductor thermal radiators, and the multiplexer 1 share one dielectric base plate 2. This structure facilitates an integration design and large-scale integration of pixels. In addition, the signal wire 51 and the grounding plates 52 in the multiplexer 1 are in the same layer, which simplifies the layer process and facilitates processing. The problems of the complex process and the inconvenient integration, due to that in the traditional multiplexer adopting the terminal short-circuit microstrip line with a quarter wavelength, the metal conductor and the grounding plate are not in the same plane, the grounding plate needs to be disposed on the other surface of the dielectric base plate 2, and the grounding is achieved through the metal via hole, are avoided.

The detector is mainly manufactured by using a superconducting thin film, and the multiplexer 1 provided in this embodiment of the present disclosure is also manufactured by using the superconducting thin film. In this way, the multiplexer 1 may be directly interconnected and integrated with the antenna, the orthogonal mode coupler, and the dynamic inductor thermal radiators on a silicon substrate, so that a millimeter wave superconducting detector is obtained based on a simple single-layer planar structure by adopting a photolithography process. The millimeter wave superconducting detector has a simple structure, is easy to manufacture, has a small size, is easy to integrate, and has broad application prospects in superconducting detector arrays.

Those skilled in the art will easily come up with other implementation solutions of the present disclosure after considering the specification and practicing the present disclosure disclosed herein. The present disclosure aims to cover any variations, uses, or adaptive changes of the present disclosure, which follow general principles of the present disclosure and include common knowledge or customary technical means in the art not disclosed in the present disclosure. The specification and embodiments are only considered exemplary, and the true scope and spirit of the present disclosure are indicated by the following claims.

It should be understood that the present disclosure is not limited to the precise structure described above and shown in the drawings, and various modifications and changes can be made without departing from its scope. The scope of the present disclosure is limited only by the appended claims.

The invention claimed is:

1. A multiplexer, comprising:

a dielectric base plate, wherein a conductive thin film layer is disposed on a side plane of the dielectric base plate, the conductive thin film layer comprises a signal wire and one or more grounding plates on a side of the signal wire, and there is one or more gaps between the signal wire and the one or more grounding plates;

a connection structure, disposed on the conductive thin film layer, and comprising a main branch and a plurality of branches, wherein the main branch is connected to the plurality of branches respectively, and the main branch serves as an input port of the multiplexer; and a plurality of bandpass filters with different operation frequencies, wherein each of the plurality of bandpass filters is connected to the signal wire and the one or more grounding plates;

wherein each bandpass filter comprises a first port and a second port, the first port is connected to a corresponding branch respectively, and the second port serves as one of output ports of the multiplexer.

2. The multiplexer of claim 1, wherein the plurality of branches comprises a first branch and a second branch;

the plurality of bandpass filters with different operation frequencies comprise a first bandpass filter and a second bandpass filter;

the first port of the first bandpass filter is connected to the first branch; and the first port of the second bandpass filter is connected to the second branch.

3. The multiplexer of claim 1, wherein an impedance of each branch matches an operation frequency of a bandpass filter which corresponds to the branch, and does not match an operation frequency of a bandpass filter which corresponds to other branch.

4. The multiplexer of claim 1 , wherein each bandpass filter comprises one or more first resonant units and one or more second resonant units;

each of the one or more first resonant units and the one or more second resonant units generates a zero point and a pole point;

the one or more first resonant units are coupled to the one or more second resonant units; and frequencies of pole points are located between frequencies of zero points.

5. The multiplexer of claim 4, wherein two sides of the signal wire both are provided with one or more grounding plates;

each of the one or more first resonant units and the one or more second resonant units is connected to the signal wire and the one or more grounding plates on the two sides of the signal wire, and the one or more first resonant units and the one or more second resonant units both are symmetrically disposed with respect to the signal wire.

6. The multiplexer of claim 4, wherein the one or more first resonant units are coupled to the one or more second resonant units by the signal wire; and/or the one or more first resonant units and the one or more second resonant units are quasi-lumped resonant units.

7. The multiplexer of claim 4, wherein each bandpass filter comprises two first resonant units and two second resonant units;

one first resonant unit of the two first resonant units is coupled to one second resonant unit of the two second resonant units, to form a first coupling unit;

other first resonant unit of the two first resonant units is coupled to other second resonant unit of the two second resonant units, to form a second coupling unit; and the first coupling unit is coupled to the second coupling unit via the two first resonant units or the two second resonant units;

the first coupling unit and the second coupling unit are symmetrically disposed with respect to a coupling part between the first coupling unit and the second coupling unit;

and the first coupling unit is coupled to the second coupling unit by the signal wire.

8. The multiplexer of claim 4, wherein each of the one or more first resonant units comprises one or more first capacitors and one or more first inductors; wherein the one or more first capacitors and the one or more first inductors are connected in parallel between the signal wire and the one or more grounding plates, wherein each of the one or more first capacitors is an interdigital capacitor; and each of the one or more second resonant units comprises a second capacitor, one or more second inductors, and one or more third inductors; wherein the second capacitor is connected in series with the signal wire, the one or more second inductors are connected in parallel with the second capacitor, and the one or more third inductors are connected between the signal wire and the one or more grounding plates; wherein the second capacitor is an interdigital capacitor.

9. The multiplexer of claim 8, wherein the first resonant unit comprises two first capacitors and two first inductors, and the two first capacitors and the two first inductors are all symmetrically disposed with respect to the signal wire; and the second resonant unit comprises two second inductors and two third inductors, and the first capacitor, the two second inductors, and the two third inductors are all symmetrically disposed with respect to the signal wire.

10. A detector, comprising an antenna, an orthogonal mode coupler, a plurality of dynamic inductor thermal radiators, and a multiplexer; wherein the multiplexer comprises:

a dielectric base plate, wherein a conductive thin film layer is disposed on a side plane of the dielectric base plate, the conductive thin film layer comprises a signal wire and one or more grounding plates on a side of the signal wire, and there is one or more gaps between the signal wire and the one or more grounding plates;

a connection structure, disposed on the conductive thin film layer, and comprising a main branch and a plurality of branches, wherein the main branch is connected to the plurality of branches respectively, and the main branch serves as an input port of the multiplexer; and a plurality of bandpass filters with different operation frequencies, wherein each of the plurality of bandpass filters is connected to the signal wire and the one or more grounding plates;

wherein each bandpass filter comprises a first port and a second port, the first port is connected to a corresponding branch respectively, and the second port serves as one of output ports of the multiplexer;

wherein the antenna is connected to the orthogonal mode coupler;

the orthogonal mode coupler is connected to an input port;

the plurality of dynamic inductor thermal radiators are respectively connected to a plurality of output ports; and the orthogonal mode coupler, the plurality of dynamic inductor thermal radiators, and the multiplexer share one dielectric base plate.

11. The detector of claim 10, wherein the plurality of branches comprises a first branch and a second branch;

the plurality of bandpass filters with different operation frequencies comprise a first bandpass filter and a second bandpass filter;

the first port of the first bandpass filter is connected to the first branch; and the first port of the second bandpass filter is connected to the second branch.

12. The detector of claim 10, wherein an impedance of each branch matches an operation frequency of a bandpass filter which corresponds to the branch, and does not match an operation frequency of a bandpass filter which corresponds to other branch.

13. The detector of claim 10, wherein each bandpass filter comprises one or more first resonant units and one or more second resonant units;

each of the one or more first resonant units and the one or more second resonant units generates a zero point and a pole point;

the one or more first resonant units are coupled to the one or more second resonant units; and a frequency of each of pole points is located between frequencies of zero points.

14. The detector of claim 13, wherein two sides of the signal wire both are provided with one or more grounding plates;

each of the one or more first resonant units and the one or more second resonant units is connected to the signal wire and the one or more grounding plates on the two sides of the signal wire, and the one or more first resonant units and the one or more second resonant units both are symmetrically disposed with respect to the signal wire.

15. The detector of claim 13, wherein the one or more first resonant units are coupled to the one or more second resonant units by the signal wire; and/or the one or more first resonant units and the one or more second resonant units are quasi-lumped resonant units.

16. The detector of claim 13, wherein each bandpass filter comprises two first resonant units and two second resonant units;

one first resonant unit of the two first resonant units is coupled to one second resonant unit of the two second resonant units, to form a first coupling unit;

other first resonant unit of the two first resonant units is coupled to other second resonant unit of the two second resonant units, to form a second coupling unit; and the first coupling unit is coupled to the second coupling unit via the two first resonant units or the two second resonant units;

the first coupling unit and the second coupling unit are symmetrically disposed with respect to a coupling part between the first coupling unit and the second coupling unit; and the first coupling unit is coupled to the second coupling unit by the signal wire.

17. The detector of claim 13, wherein each of the one or more first resonant units comprises one or more first capacitors and one or more first inductors; wherein the one or more first capacitors and the one or more first inductors are connected in parallel between the signal wire and the one or more grounding plates, wherein each of the one or more first capacitors is an interdigital capacitor; and each of the one or more second resonant units comprises a second capacitor, one or more second inductors, and one or more third inductors; wherein the second capacitor is connected in series with the signal wire, the one or more second inductors are connected in parallel with the second capacitor, and the one or more third inductors are connected between the signal wire and the one or more grounding plates; wherein the second capacitor is an interdigital capacitor.

18. The detector of claim 17, wherein the first resonant unit comprises two first capacitors and two first inductors, and the two first capacitors and the two first inductors are all symmetrically disposed with respect to the signal wire; and the second resonant unit comprises two second inductors and two third inductors, and the first capacitor, the two second inductors, and the two third inductors are all symmetrically disposed with respect to the signal wire.

* * * * *